United States Patent
Cho et al.

(10) Patent No.: US 7,884,328 B2
(45) Date of Patent: Feb. 8, 2011

(54) MICROBOLOMETER WITH IMPROVED MECHANICAL STABILITY AND METHOD OF MANUFACTURING THE SAME

(75) Inventors: Seong Mok Cho, Daejeon (KR); Ho Jun Ryu, Seoul (KR); Woo Seok Yang, Daejeon (KR); Sang Hoon Cheon, Daejeon (KR); Byoung Gon Yu, Daejeon (KR); Chang Auck Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 122 days.

(21) Appl. No.: 12/181,871

(22) Filed: Jul. 29, 2008

(65) Prior Publication Data

US 2009/0152466 A1    Jun. 18, 2009

(30) Foreign Application Priority Data

Dec. 14, 2007    (KR) ...................... 10-2007-0130698

(51) Int. Cl.
*H01L 27/14*    (2006.01)
(52) U.S. Cl. .................................. 250/338.1; 257/467
(58) Field of Classification Search .............. 250/338.1; 257/467
See application file for complete search history.

(56) References Cited

U.S. PATENT DOCUMENTS

| | | | |
|---|---|---|---|
| 5,021,663 A | | 6/1991 | Hornbeck |
| 5,399,897 A | * | 3/1995 | Cunningham et al. ....... 257/467 |
| 5,602,393 A | * | 2/1997 | Gerard ..................... 250/338.4 |
| 6,144,285 A | | 11/2000 | Higashi |
| 6,218,667 B1 | * | 4/2001 | Nonaka et al. ............. 250/353 |

FOREIGN PATENT DOCUMENTS

| | | |
|---|---|---|
| JP | 10-185681 | 7/1998 |
| JP | 2003-337066 | 11/2003 |
| KR | 10-2004-0087025 | 10/2004 |

OTHER PUBLICATIONS

Almasri et al., "Amorphous silicon two-color microbolometer for uncooled IR detection", IEEE Sensors Journal, vol. 6, No. 2, Apr. 2006, p. 293-300.

* cited by examiner

*Primary Examiner*—David P Porta
*Assistant Examiner*—Shun Lee
(74) *Attorney, Agent, or Firm*—Rabin & Berdo, P.C.

(57) ABSTRACT

Provided are a microbolometer having a cantilever structure and a method of manufacturing the same, and more particularly, a microbolometer having a three-dimensional cantilever structure, which is improved from a conventional two-dimensional cantilever structure, and a method of manufacturing the same. The method includes providing a substrate including a read-out integrated circuit and a reflective layer for forming an absorption structure, forming a sacrificial layer on the substrate, forming a cantilever structure having an uneven cross-section in the sacrificial layer, forming a sensor part isolated from the substrate by the cantilever structure, and removing the sacrificial layer.

9 Claims, 10 Drawing Sheets

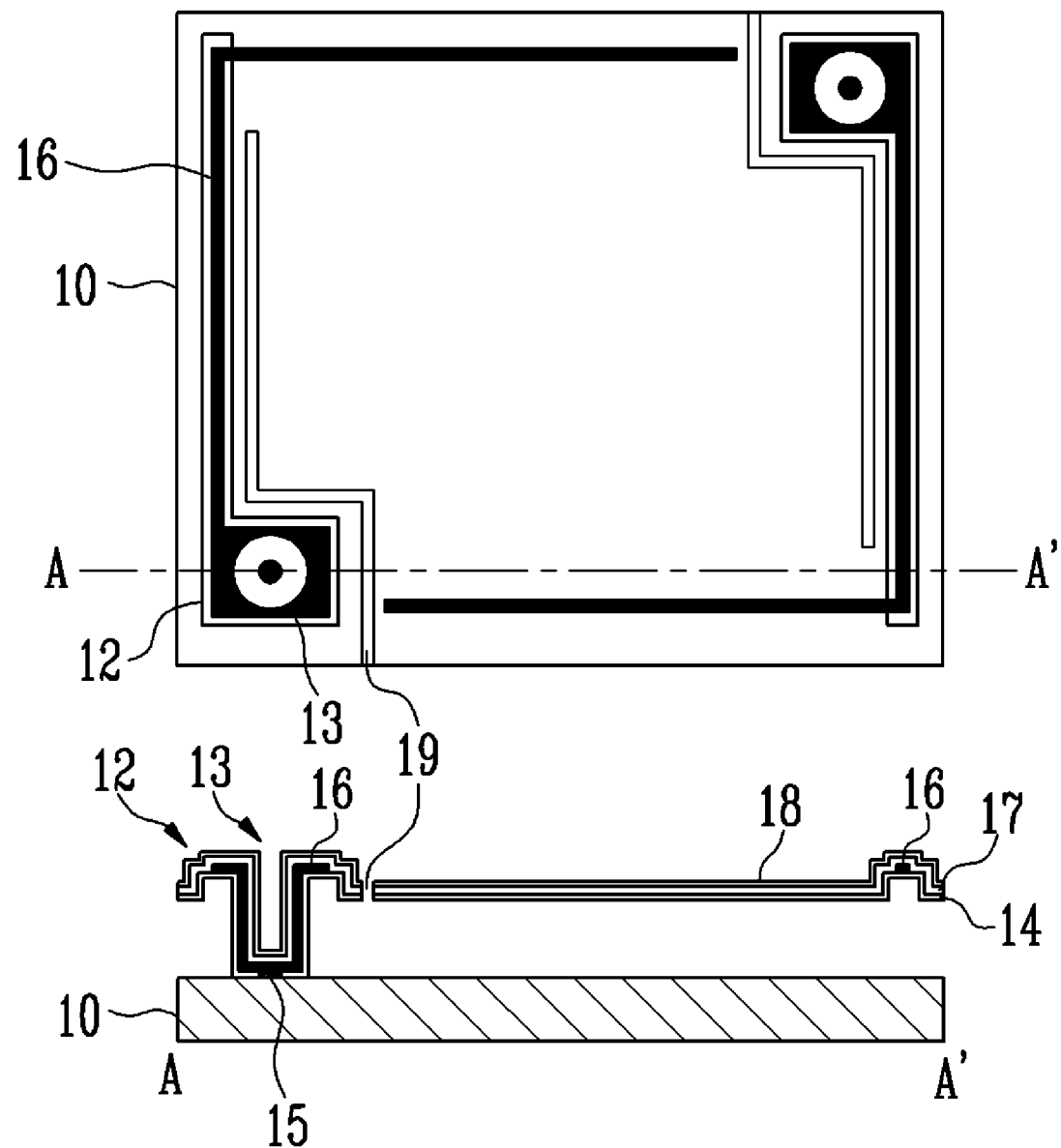

MICROBOLOMETER WITH IMPROVED MECHANICAL STABILITY AND METHOD OF MANUFACTURING THE SAME

CROSS-REFERENCE TO RELATED APPLICATION

This application claims the benefit of Korean Patent Application No. 2007-130698, filed Dec. 14, 2007, the disclosure of which is hereby incorporated herein by reference in its entirety.

BACKGROUND

1. Field of the Invention

The present invention relates to a microbolometer with a cantilever and a method of manufacturing the same, and more particularly, to a microbolometer having a three-dimensional cantilever, which is an improvement to a conventional two-dimensional cantilever, and a method of manufacturing the same. Using the three-dimensional cantilever in accordance with the present invention, mechanical stability of the microbolometer can be improved, so that it is possible to manufacture a thinner structure of the microbolometer and accordingly a fill factor of a sensor of the entire structure can be increased.

The present invention is derived from the work supported by the IT R&D program of the Ministry of Information and Communication and the Institute for Information Technology Advancement (South Korea) [Project Management Number: 2006-S-054-02, Project title: Development of CMOS-based MEMS processed multi-functional sensor for ubiquitous environment].

2. Discussion of Related Art

A basic operation principle of an uncooled infrared sensor is to detect variation in temperature of a sensor through absorption of incident infrared light. The uncooled infrared sensor can be classified into a microbolometer type, a pyroelectric type, a thermopile type, and so on, depending on a temperature variation detection mechanism. Since the magnitude of a reaction signal of the microbolometer is determined based on variation in temperature of the sensor, the sensor should be thermally isolated from the circumference in order to maximize detection efficiency. For this purpose, in general, a sensor has a MEMS structure with a cantilever providing thermal insulation function. Structure of the conventional uncooled microbolometer is schematically shown in FIG. 1. As shown in FIG. 1, the conventional microbolometer includes a two-dimensional cantilever providing thermal insulation and mechanical support functions. However, while such a planar cantilever has good horizontal distortion characteristics, it has weak vertical distortion characteristics. This is because the cross-section of the cantilever has a small vertical inertia moment.

In order to manufacture a high performance microbolometer, thermal insulating characteristics should be improved. For this purpose, the thickness and width of the cantilever should be minimized and the length thereof should be maximized. However, when the planar cantilever becomes thinner or narrower, it can be easily distorted, so that the deviation between sensor pixels can be increased. When the distortion of the cantilever is serious, the microbolometer structure becomes in contact with a substrate, so that the thermal insulation thereof may fail. Therefore, in order to manufacture a high performance microbolometer, mechanical stability of the conventional planar cantilever should be improved.

SUMMARY OF THE INVENTION

In order to solve the above problems, the present invention proposes a microbolometer with a three-dimensional cantilever to improve mechanical stability, and a method of manufacturing the same.

The cantilever in accordance with the present invention can have a smaller thickness and width than the conventional one to reduce the thickness of a membrane of a sensor. Therefore, a thermal capacity of a MEMS sensor is reduced and a thermal time constant determined by the thermal capacity and thermal conductivity is also reduced, so that a reaction speed of the microbolometer can be increased. Accordingly, the microbolometer can perform rapid operation without reduction in sensor signal.

In addition, the cantilever in accordance with the present invention can have a smaller thickness and width than the conventional one to widen a reaction region of the microbolometer. That is, the present invention can provide a microbolometer with improved reaction characteristics by improving thermal insulating characteristic as well as increasing a fill factor of a sensor, in comparison with the conventional art.

According to one aspect of the present invention, a method of manufacturing a microbolometer includes: providing a substrate including a read-out integrated circuit and a reflective layer for forming an absorption structure; forming a sacrificial layer on the substrate; forming a cantilever having an uneven cross-section in the sacrificial layer; forming a sensor part isolated from the substrate by the cantilever; and removing the sacrificial layer.

According to another aspect of the present invention, a microbolometer includes: a substrate including a read-out integrated circuit and a reflective layer for forming an absorption structure; a cantilever formed on the substrate and having an uneven cross-section; and a sensor part isolated from the substrate by the cantilever and having a sensor material and an electrode.

BRIEF DESCRIPTION OF THE DRAWINGS

The above and other features of the present invention will be described in reference to certain exemplary embodiments thereof with reference to the attached drawings in which:

FIGS. 3A to 3I are views showing a method of manufacturing a microbolometer having a cantilever in accordance with another exemplary embodiment of the present invention and the microbolometer manufactured by the same method.

DETAILED DESCRIPTION OF PREFERRED EMBODIMENTS

The present invention will now be described more fully hereinafter with reference to the accompanying drawings, in which preferred embodiments of the invention are shown.

In manufacturing a microbolometer having a cantilever in accordance with the present invention, the cantilever is configured to have a three-dimensional structure to improve distortion characteristics of the microbolometer. In addition, since a three-dimensional cantilever in accordance with the present invention can reduce its thickness and width, it is possible to improve reaction characteristics such as a reaction speed, and so on.

The three-dimensional cantilever in accordance with the present invention is formed using good step coverage of a chemical vapor deposition (CVD) process. After forming a sacrificial layer, a step is previously formed on a cantilever region of the sacrificial layer through patterning before depositing a lower passivation layer. The step may be formed through an embossing or intaglioing method.

Hereinafter, exemplary embodiments of the present invention will be described in detail. The following embodiments are provided for the convenience of detailed description, not limiting the present invention. In addition, the present invention may further include a process or a structure, which is not described in detail in the following description or process of the embodiments. For example, although an absorption layer for absorbing infrared light will not be described in detail, since it is not a main feature of the present invention, it is generally used to form a microbolometer in practice, and may be added at any process step. For example, the absorption layer may be formed in forming a lower passivation or an upper passivation layer.

Embodiment 1

FIGS. 2A to 2I are views showing a method of manufacturing a microbolometer having a cantilever and the microbolometer manufactured by the same method.

Figure 1:
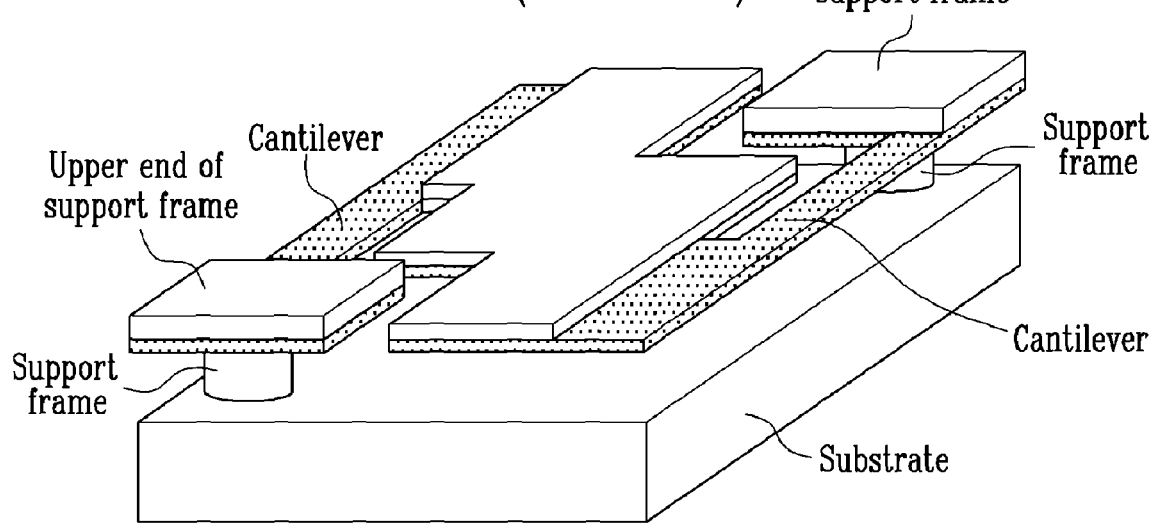
FIG. 1 is a schematic perspective view of a conventional microbolometer having a two-dimensional cantilever.
Figure 2A:
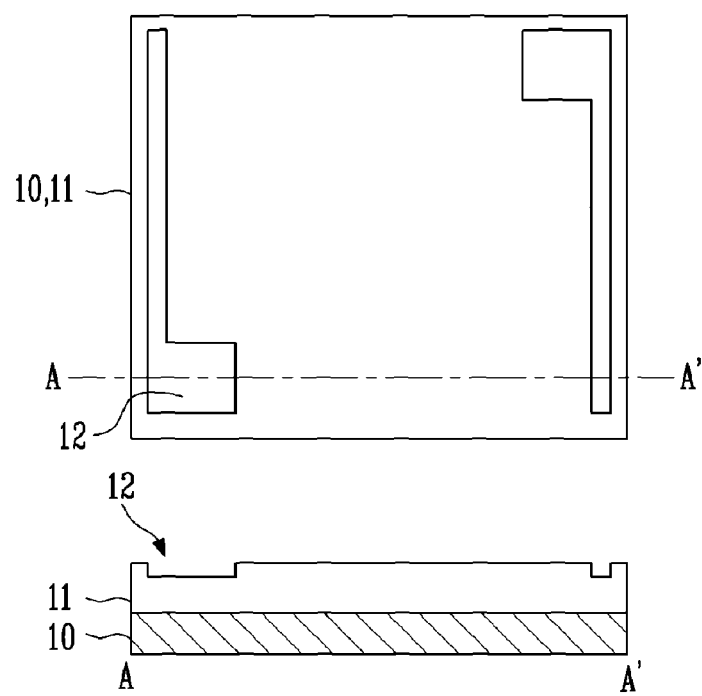
FIGS. 2A to 2I are views showing a method of manufacturing a microbolometer having a three-dimensional cantilever in accordance with an exemplary embodiment of the present invention and the microbolometer manufactured by the same method.
Figure 2B:
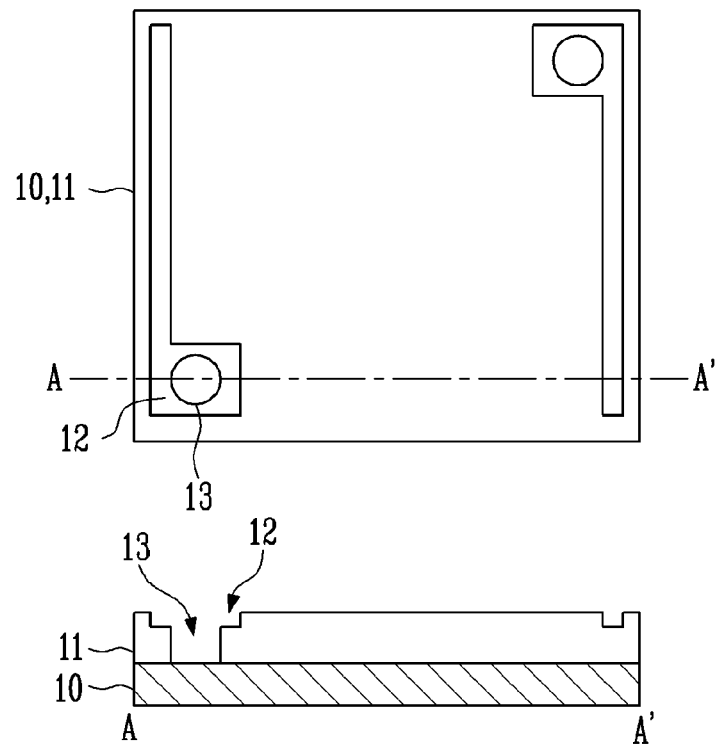
Figure 2C:
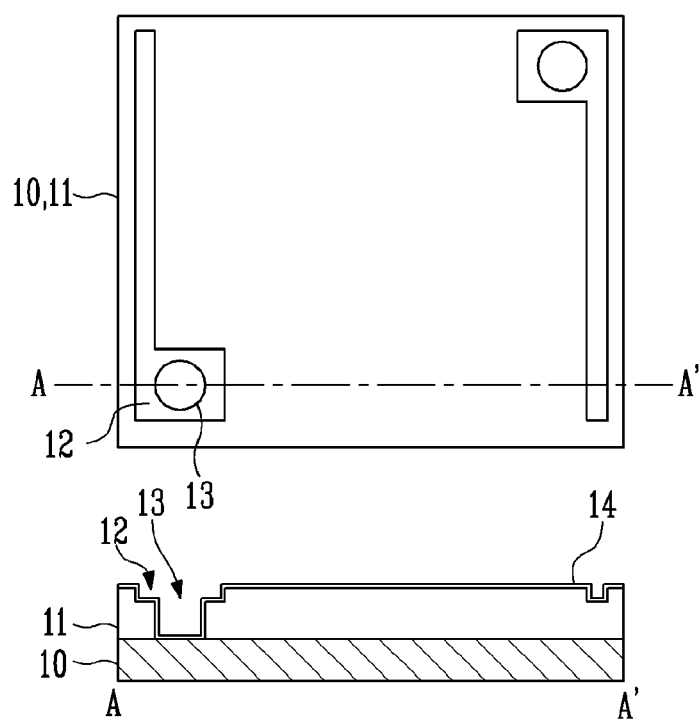

A sacrificial layer 11 is formed on a substrate 10 including a read-out integrated circuit (ROIC) and a reflective layer for forming an absorption structure. The sacrificial layer 11 may be generally formed of a polyimide-based organic material. However, it also may be formed of a silicon oxide layer, a polysilicon layer, or an amorphous silicon layer, depending on necessity. The sacrificial layer has a thickness dependant on a wavelength applied to the microbolometer. For example, the sacrificial layer may have a thickness around 2 μm for operation of a wavelength of 10 μm. After forming the sacrificial layer 11, a step 12 is prepared to form a three-dimensional cantilever. The step is patterned using a known photolithography or dry etching process, the result of which is shown in FIG. 2A. An upper part of FIG. 2A is a plan view of the microbolometer, and a lower part of FIG. 2A is a cross-sectional view taken along the line A-A' of the plan view. The step 12 may have a depth of 0.1 to 1.5 μm. As shown in FIG. 2B, after forming the step 12, an anchor 13 is patterned at a bottom surface of the step 12 to function as a support frame between the substrate and an upper structure. After patterning the anchor 13, a lower passivation layer 14 is deposited on the sacrificial layer to function as a lower membrane. As a result, the cantilever structure has an uneven cross-section. The lower passivation layer 14 may be formed of a silicon nitride layer or a silicon oxide layer. In order to improve deposition uniformity of the step region, a chemical vapor deposition (CVD) method may be used.

Figure 2D:
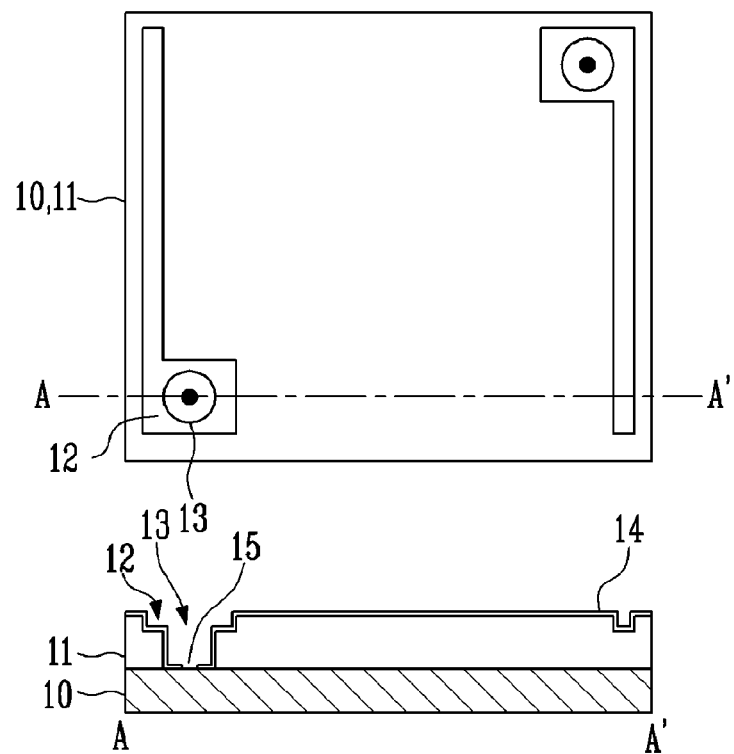
Figure 2E:
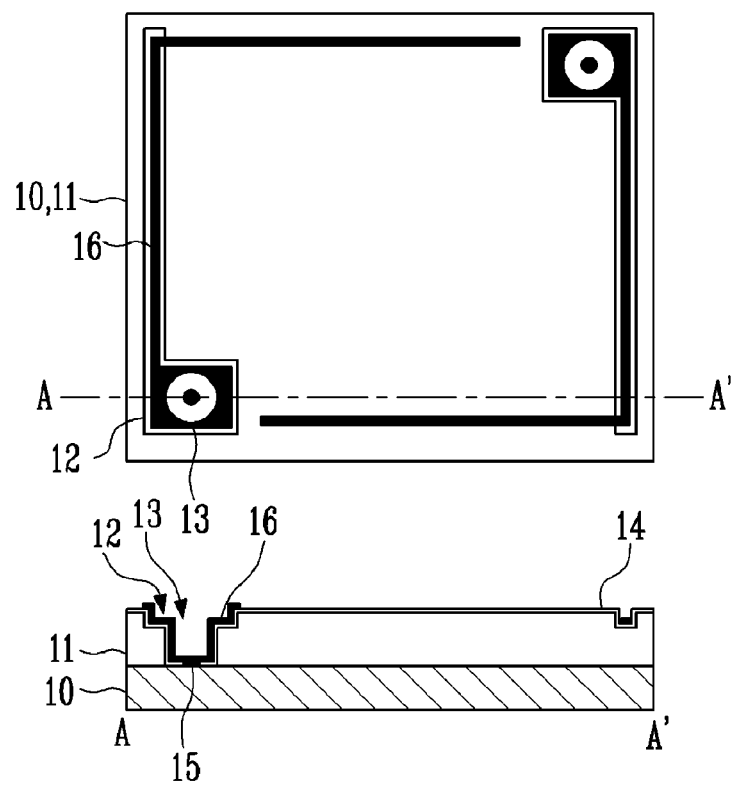
Figure 2F:
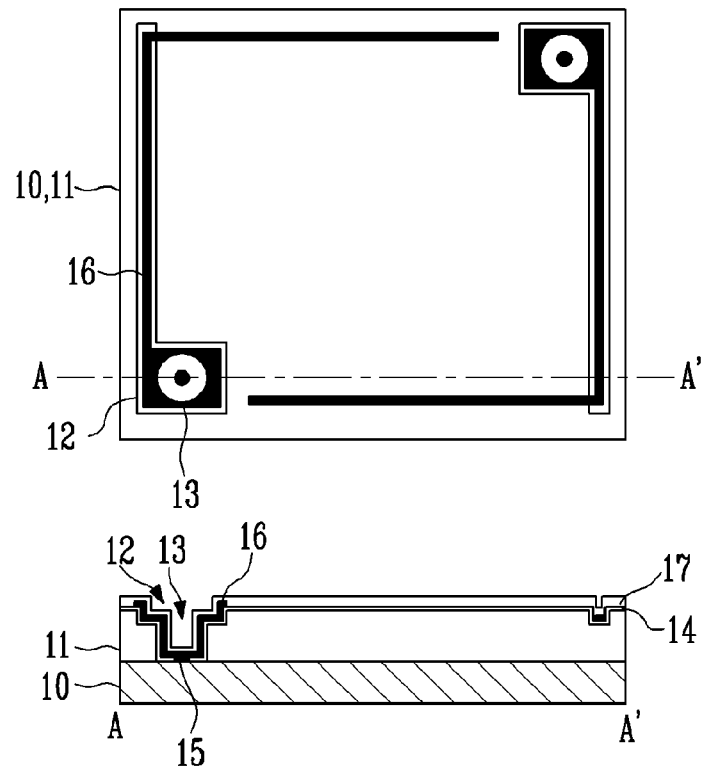
Figure 2G:
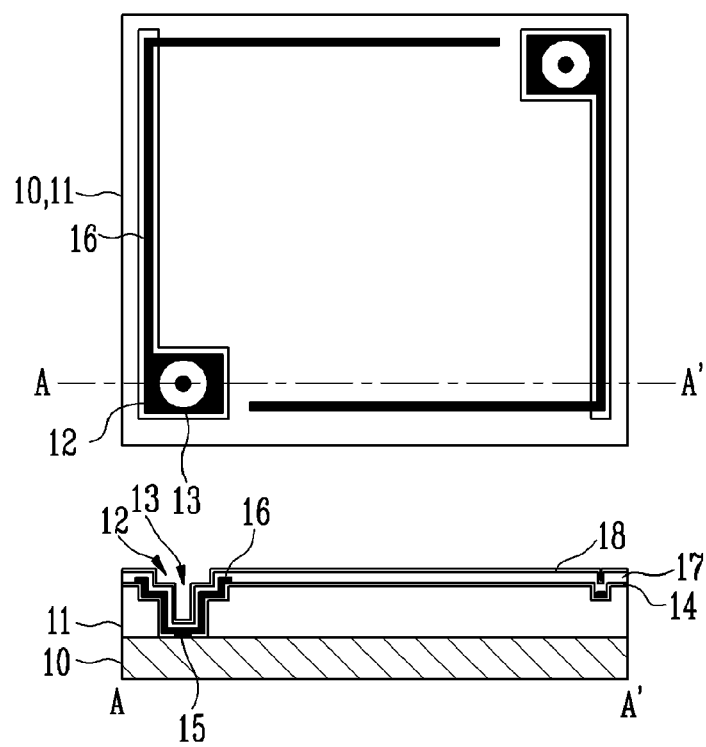
Figure 2H:
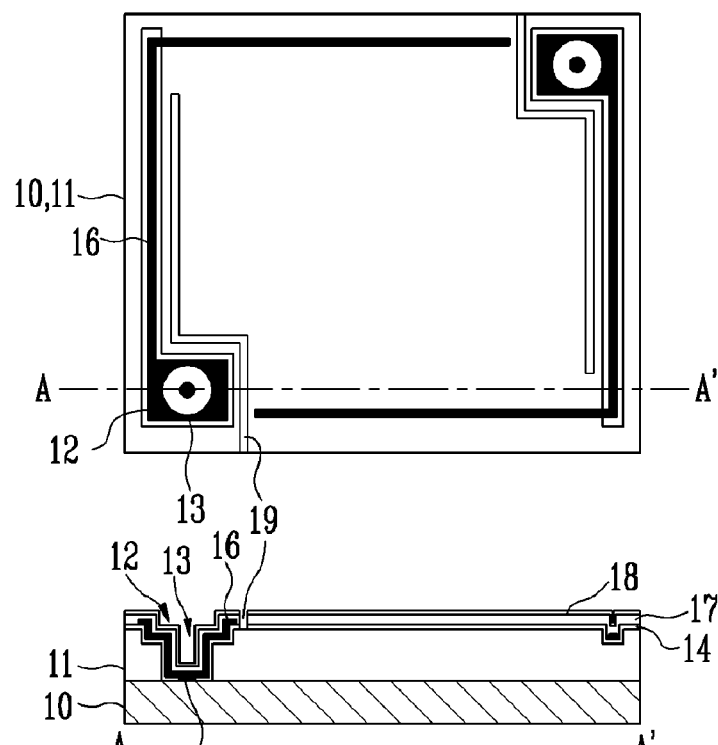

As shown in FIG. 2D, after depositing the lower passivation layer 14, a contact hole 15 is formed in the lower passivation layer on the bottom surface of the anchor to form an electrical interconnection with the read-out integrated circuit. Then, an electrode 16 is formed on the lower passivation layer of the cantilever (see FIG. 2E). While the electrode 16 in this embodiment has shape similar to L shape, the electrode may have different shape depending on the sensor characteristics. The electrode 16 may be formed of a metal such as Ni—Cr, Ti, TiN, or the like. In case that the step is deeply formed due to the anchor pattern so that the electrode having a small thickness may cause a problem of interconnection reliability in the step region, a metal deposition and patterning process may be added to form an interconnection in a contact region for smooth connection. After forming the electrode 16, a sensor material 17 is deposited on the entire surface of the sacrificial layer, as shown in FIG. 2F. The sensor material may be one of amorphous silicon, polysilicon, a vanadium oxide layer, and so on. As shown in FIG. 2G, after depositing the sensor material 17, an upper passivation layer 18 is deposited on the entire surface of the sacrificial layer to function as an upper membrane. The upper passivation layer 18 may also be a silicon nitride layer or a silicon oxide layer. As shown in FIG. 2H, the upper passivation layer 18 is patterned to form a passage 19 for an etching material to enable the following etching of the sacrificial layer.

Figure 2I:
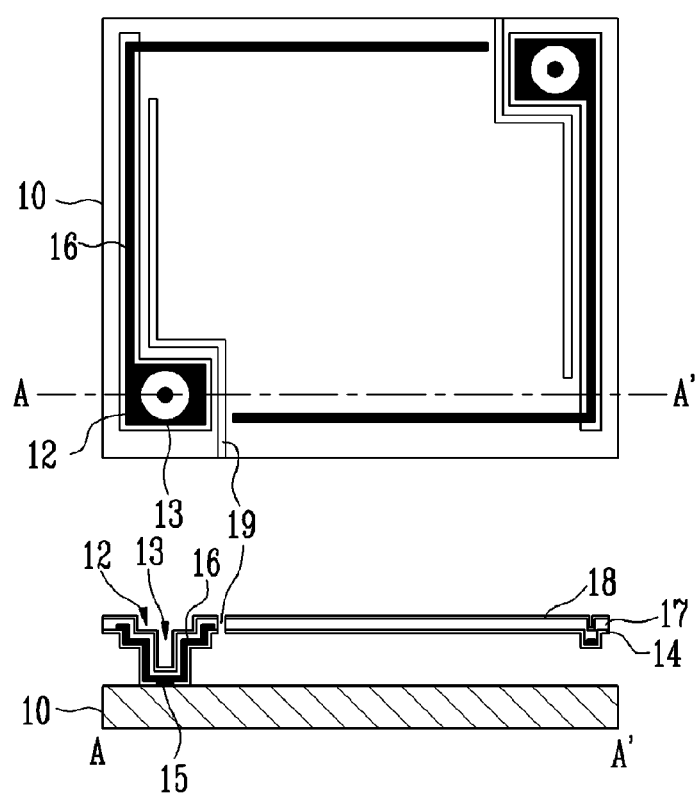

FIG. 2I shows the microbolometer in accordance with the present invention completed by removing the sacrificial layer through the passage 19 using oxygen plasma.

Embodiment 2

Figure 3A:
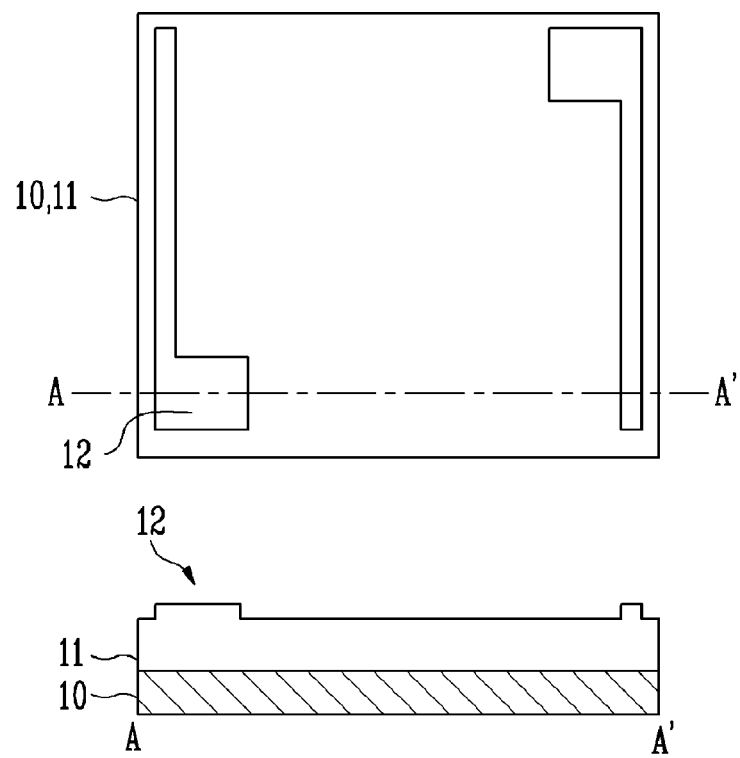
Figure 3B:
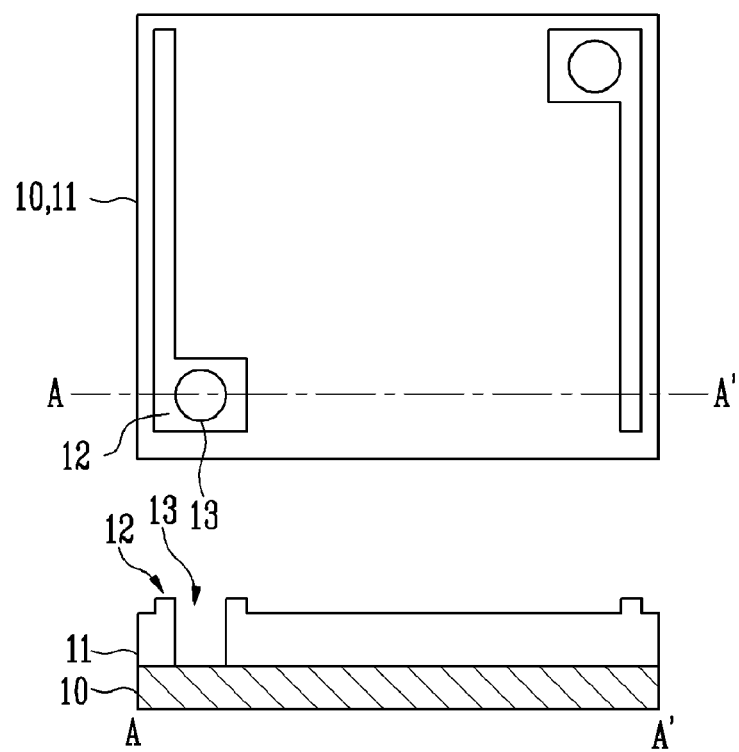
Figure 3C:
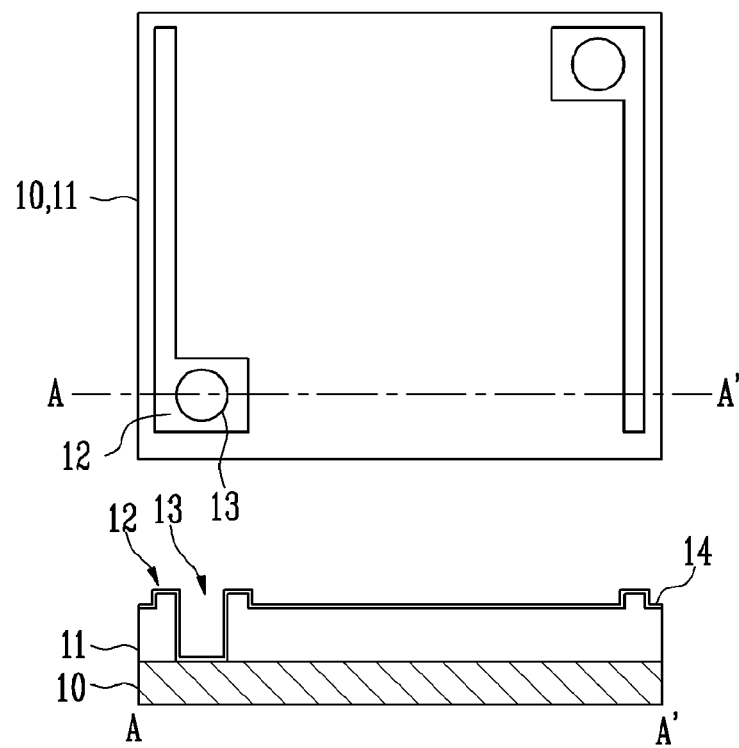
Figure 3D:
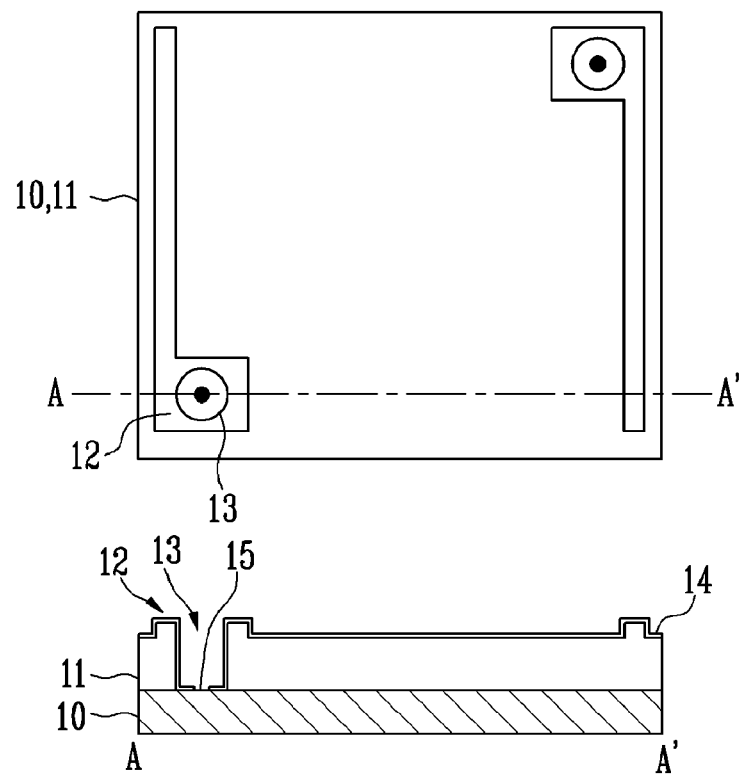
Figure 3E:
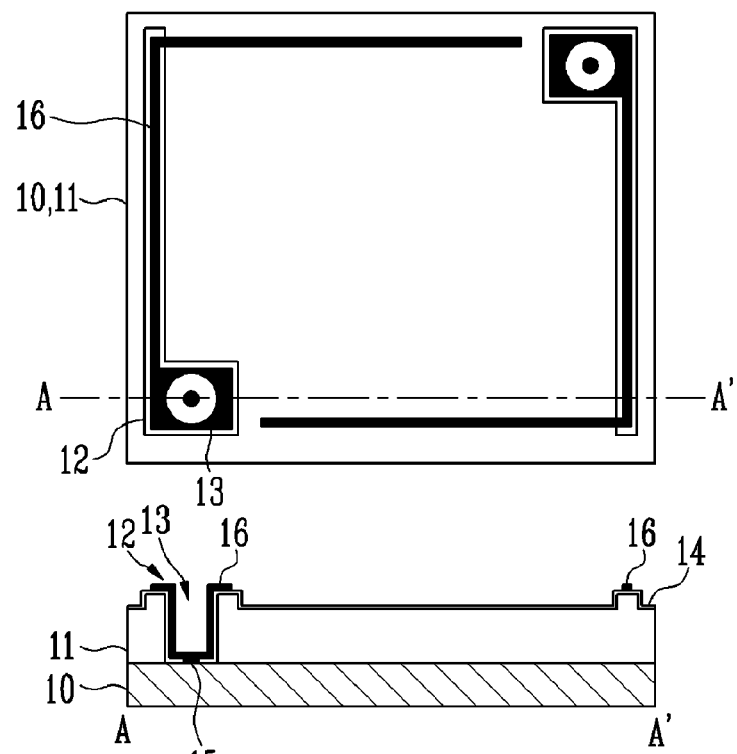
Figure 3F:
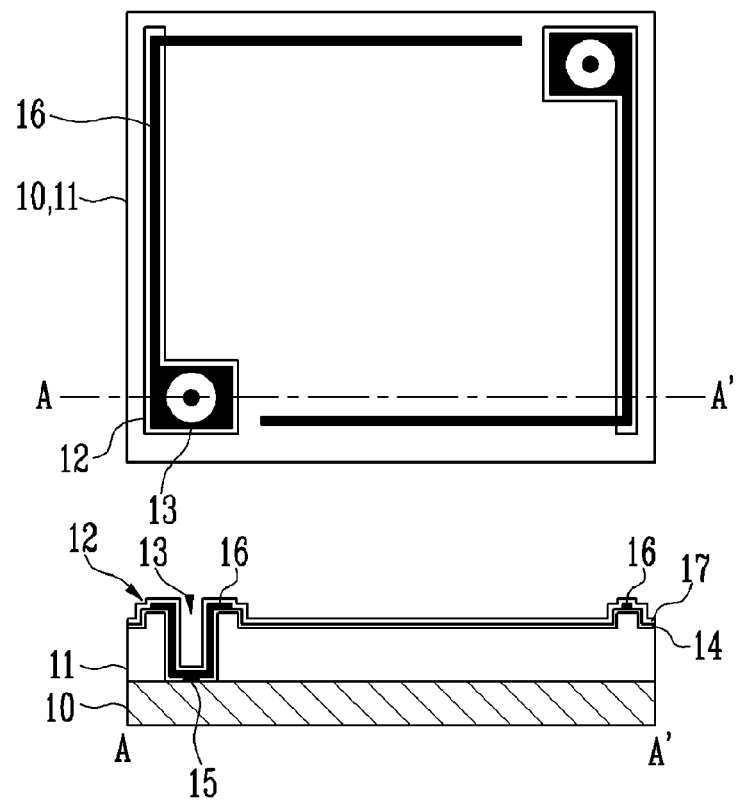
Figure 3G:
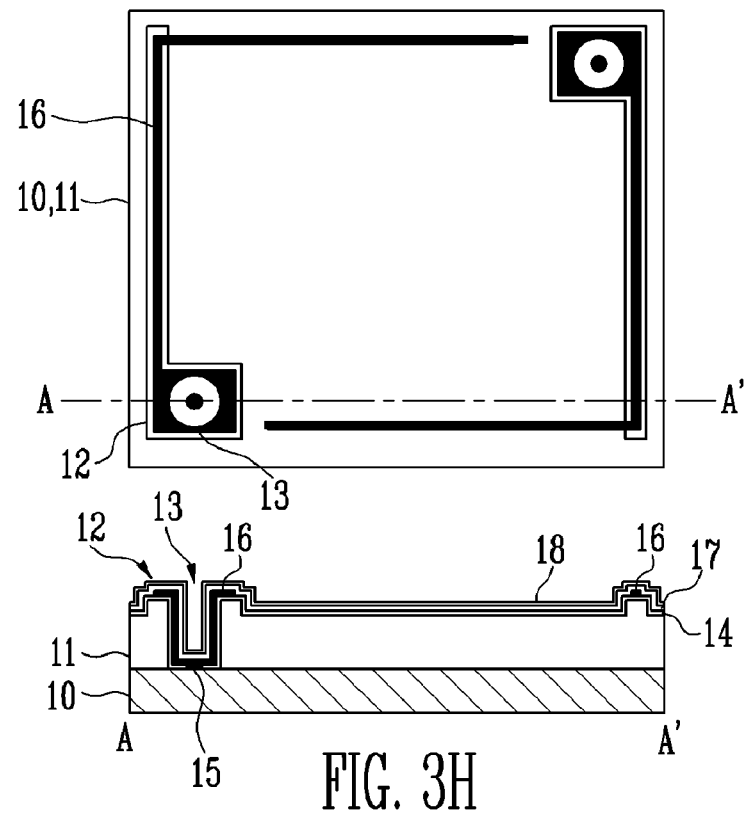
Figure 3H:
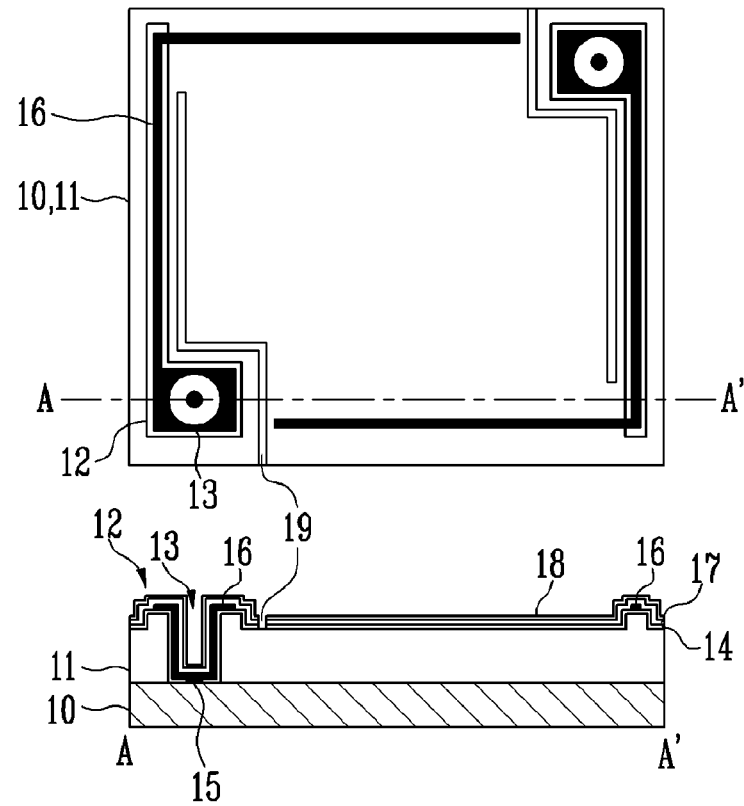

FIGS. 3A to 3I are views showing a method of manufacturing a microbolometer having a cantilever in accordance with another exemplary embodiment of the present invention and a microbolometer manufactured by the same method. FIGS. 3A to 3I show the same process steps and the same structure with those shown in FIGS. 2A to 2I, except that a step 12 shown in FIG. 3A is embossed. Therefore, reference numerals shown in FIGS. 3A to 3I designate the same elements shown in FIG. 2A to 2I. FIG. 3I shows a microbolometer manufactured according to Embodiment 2 of the present invention.

As can be seen from the foregoing, a cantilever in accordance with the present invention has an uneven cross-section, not a planar cross-section. The cantilever having the uneven cross-section has larger resistance against vertical distortion. Therefore, the microbolometer having such a cantilever can reduce the vertical distortion, resulting in uniformity between sensors. In addition, since the microbolometer in accordance with the present invention has improved mechanical stability, it is possible to manufacture the cantilever having a smaller width. Therefore, an area occupied by the cantilever is reduced, while an area of the sensor is increased, resulting in improving the characteristics of the microbolometer. Further, since the microbolometer in accordance with the present invention has good distortion characteristics, it is also possible to manufacture the cantilever having a smaller thickness. Therefore, the entire thickness of the sensor is reduced to decrease a thermal capacity of the entire microbolometer to thereby have a smaller time constant. That is, operation speed of the microbolometer is improved.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A microbolometer comprising:
a substrate including a read-out integrated circuit and a reflective layer for forming an absorption structure;
a cantilever formed on the substrate, the cantilever being supported by an end portion thereof, the cantilever extending from the end portion in a lengthwise direction over the substrate, wherein said end portion of cantilever, taken from a sectional view cut by a cutting line perpendicular to the lengthwise direction, includes a first part in contact with the substrate, a second part spaced apart from the substrate, and a third part spaced farther apart from the substrate than the second part is spaced apart from the substrate; and a sensor part isolated from the substrate by the cantilever structure.

2. The microbolometer according to claim 1, wherein the cantilever is formed by forming a sacrificial layer on the substrate, forming a step in the sacrificial layer, forming an anchor at a bottom surface of the step, depositing a lower passivation layer on the entire surface of the sacrificial layer, and removing the sacrificial layer.

3. The microbolometer according to claim 2, wherein the sensor part includes:

an electrode formed on the lower passivation layer;

a sensor material formed on the electrode; and an upper passivation layer formed on the sensor material.

4. The microbolometer according to claim 3, wherein the lower passivation layer and the upper passivation each is formed of a silicon nitride layer or a silicon oxide layer.

5. The microbolometer according to claim 2, wherein the lower passivation layer has a contact hole for electrical interconnection with the read-out integrated circuit.

6. The microbolometer according to claim 2, wherein the step is embossed or intaglioed.

7. The microbolometer according to claim 6, wherein the step is intaglioed, and a lower surface of the second part of the cantilever is disposed at a level the same as a level at which a bottom of the intaglioed step is disposed.

8. The microbolometer according to claim 6, wherein the step is embossed, and a lower surface of the third part of the cantilever is disposed at a level the same as a level at which a top of the embossed step is disposed.

9. The microbolometer according to claim 2, wherein the step has a depth of 0.1 µm to 1.5 µm.

* * * * *